(12) United States Patent
Kamimura et al.

(10) Patent No.: US 7,385,194 B2
(45) Date of Patent: Jun. 10, 2008

(54) CHARGED PARTICLE BEAM APPLICATION SYSTEM

(75) Inventors: Osamu Kamimura, Kawasaki (JP);
Tadashi Kanosue, Saitama (JP);
Yasunari Sohda, Kawasaki (JP);
Susumu Goto, Utsunomiya (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 170 days.

(21) Appl. No.: 11/475,934

(22) Filed: Jun. 28, 2006

(65) Prior Publication Data
US 2007/0023654 A1    Feb. 1, 2007

(30) Foreign Application Priority Data
Jun. 28, 2005   (JP)   ............................. 2005-187807

(51) Int. Cl.
*H01J 37/28*   (2006.01)
*G01N 13/10*   (2006.01)

(52) U.S. Cl. ...................... 250/306; 250/307; 250/310; 250/396 R; 250/396 ML; 250/397; 250/492.2; 250/492.23

(58) Field of Classification Search ................. 250/306, 250/307, 310, 396 R, 396 ML, 397, 492.2, 250/492.23
See application file for complete search history.

(56) References Cited

U.S. PATENT DOCUMENTS

| | | | |
|---|---|---|---|
| 6,809,319 B2 * | 10/2004 | Sohda et al. | 250/310 |
| 6,838,682 B2 * | 1/2005 | Sohda et al. | 250/491.1 |
| 7,244,932 B2 * | 7/2007 | Nakasuji et al. | 250/306 |

OTHER PUBLICATIONS

Masato Muraki et al., "New Concept for High-Throughput Multielectron Beam Direct Write System", J. Vac. Sci. Technol. B., vol. 18, No. 6 (Nov./Dec. 2000), pp. 3061-3066.

* cited by examiner

*Primary Examiner*—Nikita Wells
(74) *Attorney, Agent, or Firm*—Reed Smith LLP; Stanley P. Fisher, Esq.; Juan Carlos A. Marquez, Esq.

(57) ABSTRACT

An object of the present invention is to measure a landing angle even in a multi electron beam lithography system in which current amount of each beam is small. Another object thereof is to measure an absolute value of the landing angle and a relative landing angle with the high SN ratio. In a transmission detector including two diaphragm plates (first and second diaphragms) and a detector, a detection angle determined by a distance between the first and second diaphragms and an aperture diameter of the second diaphragm is made equal to or smaller than the divergence angle of the electron beam to be measured, and the landing angle is determined based on the relation between a center of the fine hole of the first diaphragm and the center of the aperture of the second diaphragm at which the amount of detected current is maximum.

19 Claims, 10 Drawing Sheets

INDEX OF APERTURE
(4, 3)

CHARGED PARTICLE BEAM APPLICATION SYSTEM

CROSS-REFERENCE TO RELATED APPLICATION

The present application claims priority from Japanese Patent Application No. JP 2005-187807 filed on Jun. 28, 2005, the content of which is hereby incorporated by reference into this application.

TECHNICAL FIELD OF THE INVENTION

The present invention relates to a charged particle beam application system. More particularly, it relates to a technology effectively applied to a charged particle beam lithography system such as an electron beam lithography system and an ion beam lithography system for use in lithography for a semiconductor integrated circuit device, a charged particle beam observation system such as a scanning electron microscope, and a charged particle beam processing system such as a focused ion beam processing system.

BACKGROUND OF THE INVENTION

As the technology for the charged particle beam application system, the inventors of the present invention have examined the following technology.

The landing angle of the charged particle beam (hereinafter, simply referred to as "beam") means the angle between a normal of an object to which a beam is irradiated and an optical axis of a beam. More specifically, when a beam is irradiated to a sample, the angle between a normal of the sample and the optical axis of the beam indicates the landing angle to the sample, and when a beam is irradiated to a detector, the angle between a normal of the detection plane and the optical axis of the beam indicates the landing angle to the detector. If a detection plane and a sample are parallel to each other, the landing angle to the detector and the landing angle to the sample are equal. If not parallel, the relation between the angles is measured to know it in advance. Note that, in the case where the detector is composed of a plurality of components (for example, the case where detection is made in combination with a mark and a detector), the landing angle can be defined by an angle between a normal of a plane of a component easy to be measured or defined (for example, mark) and an optical axis of a beam.

In the charged particle beam lithography system, the charged particle beam observation system and the charged particle beam processing system, the small landing angle is desired in general. This is because, in the case where the landing angle is large, the beam irradiation position is shifted when the height of a sample is changed, which affects the lithography, image observation and processing position. Also, the landing angle of the beam is largely related to an optical property such as beam blur in some cases, and an optical axis of the beam with large landing angle frequently deviates from the center of lens. Furthermore, the landing angle is often increased when the beam is deflected. Therefore, for the beam lithography, image observation and processing with high accuracy, a highly accurate measurement of the landing angle of the beam is indispensable.

In the conventional landing angle measurement in the lithography system, beam is deflected while changing the height and a relative landing angle at the time of deflection is obtained from the change in deflection width depending on the height.

Meanwhile, in the field of the lithography, a lot of expectations are placed on the electron beam lithography system because it has an advantage that the high resolution can be achieved due to its short wavelength. However, it also has a problem that the throughput is lower than other optical lithography systems. In such a circumstance, for the solution of the problem of throughput unique to the electron beam lithography system, a multi electron beam lithography system has been proposed (for example, "Journal of Vacuum Science and Technology", 2000, B18(6), pp. 3061 to 3066 (Non-Patent Document 1)). In this method, since the area to be exposed at one time is wider than that of the conventional method, the throughput can be improved.

SUMMARY OF THE INVENTION

Incidentally, as a result of the studies for the technology for the charged particle beam application system by the inventors of the present invention, the following facts have been revealed.

For example, in the multi electron beam lithography system, the amount of electron beam irradiated to a sample is equal to or larger than that of the conventional system. However, since the beam is divided into several beams, the amount of current of each beam is small. Therefore, it is difficult to acquire enough amount of electrons through the conventional reflection electron or secondary electron detection, and a transmission detector is required for the detection with high SN ratio.

However, it is structurally difficult to provide the marks with different heights to the transmission detector for the landing angle measurement, or the structure becomes complicated when such marks are provided. Also, for the charged particle beam with the conventional amount of charged particles, in order to measure the landing angle in a non-deflected state, that is, the absolute value of the landing angle, two or more marks have to be provided at different heights, positions of the reflection or secondary charged particles at the time when the beam is irradiated to each mark are detected, and thus, the angle is obtained from the difference in the beam positions. However, since the observation of at least one of the marks is defocused, and due to the problem of the positional accuracy of the provided marks, it is difficult to obtain the absolute value of the landing angle with high accuracy.

Furthermore, even in the measurement of the relative landing angle, if the transmission detector can be used, the detection can be performed with higher SN ratio and the measurement accuracy can be improved.

Therefore, an object of the present invention is to provide a technology capable of measuring the landing angle of a low-current beam in a charged particle beam application system.

Also, another object of the present invention is to provide a technology capable of improving the accuracy in the measurement of an absolute value of the landing angle of the beam with the conventional current amount and the measurement of a relative landing angle thereof with high SN ratio.

The above and other objects and novel characteristics of the present invention will be apparent from the description of this specification and the accompanying drawings.

The typical ones of the inventions disclosed in this application will be briefly described as follows.

More specifically, a charged particle beam application system according to the present invention comprises: a charged particle source; a charged particle lens; a stage; and means for measuring a landing angle of the charged particle beam.

Also, in the charged particle beam application system according to the present invention, the means for measuring the landing angle includes a charged particle beam detector, and the landing angle and/or a convergence angle are obtained from the amount of charged particles detected by the charged particle beam detector.

The effects obtained by typical aspects of the present invention will be briefly described below.

(1) The landing angle of a charged particle beam with small amount of current can be measured with high accuracy.

(2) Since the landing angle can be measured with high accuracy, the highly accurate optical adjustment and the writing with high positional accuracy can be achieved in the charged particle beam lithography system, and it becomes possible to improve the yield and the throughput in the semiconductor device manufacturing.

(3) Since the landing angle can be measured with high accuracy, the highly accurate optical adjustment and the image observation with high positional accuracy can be achieved in the charged particle beam observation system.

(4) Since the landing angle can be measured with high accuracy, the highly accurate optical adjustment and the processing with high positional accuracy can be achieved in the charged particle beam processing system.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

As an example of the charged particle beam lithography system, a multi electron beam lithography system is first shown in this embodiment. Note that, as described later, the present invention can be applied to other electron beam lithography systems and lithography systems using charged particles such as ion beam as well as the multi electron beam lithography system. Further, the present invention can be applied also to a charged particle beam observation system such as a scanning electron microscope and a charged particle beam processing system such as a focused ion beam processing system.

Figure 1:
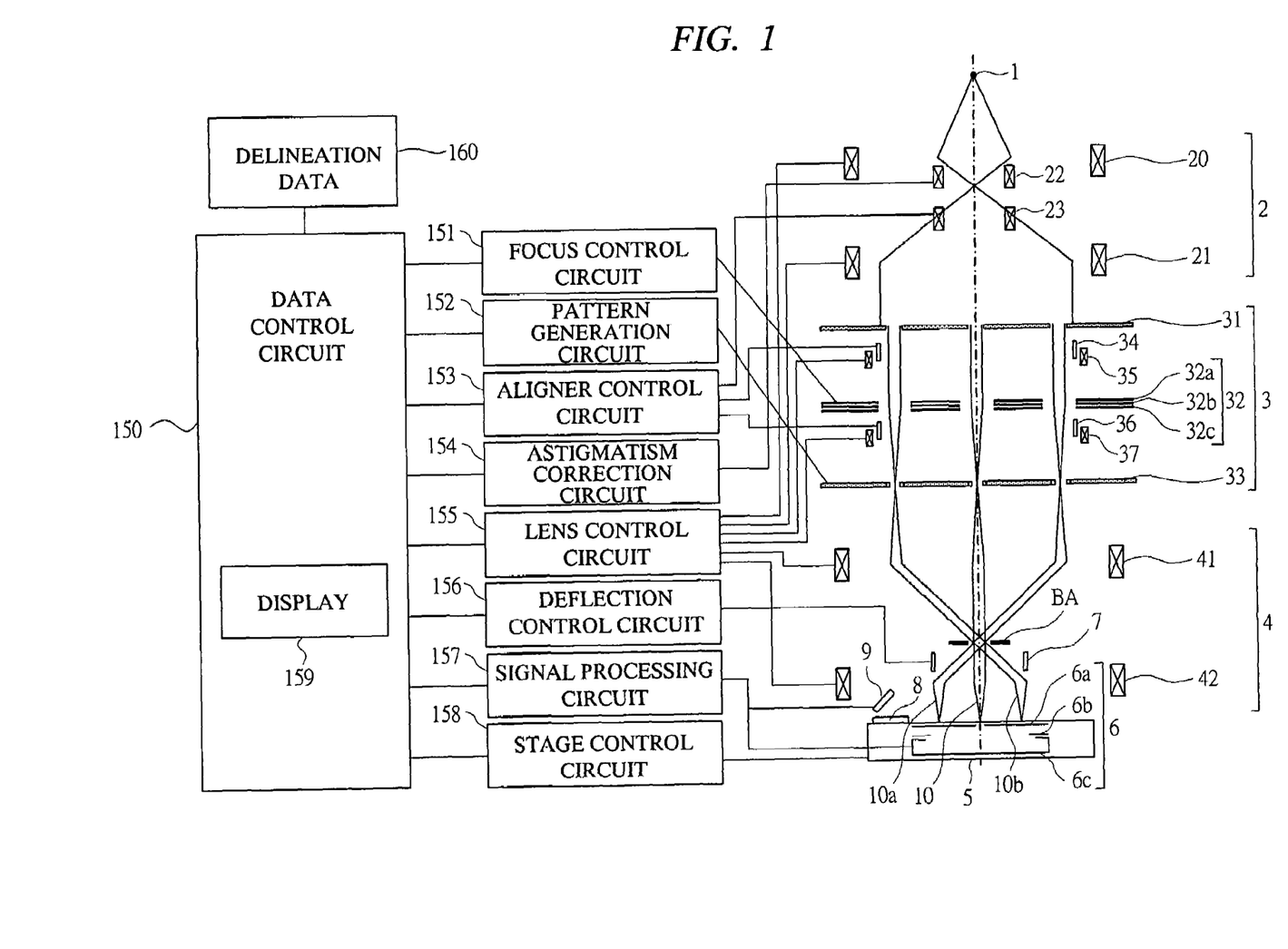
FIG. 1 is a diagram schematically showing the structure of a landing detection system and a multi electron beam lithography system according to an embodiment of the present invention.

FIG. 1 is a diagram schematically showing the structure of a landing detection system and a multi electron beam lithography system according to an embodiment of the present invention.

First, the structure and operation of the multi electron beam lithography system according to this embodiment will be described with reference to FIG. 1. The multi electron beam lithography system according to this embodiment is mainly composed of an electron source 1, an illumination optics 2, a multi source module 3, a projection optics 4, a stage 5, a landing detection system 6, a mark 8, a reflection/secondary electron detector 9, a control unit, and others.

The electron beam emitted from the electron source 1 reaches the multi source module 3 via the illumination optics 2 including an electron source demagnification lens 20 and a collimator lens 21. An astigmatism corrector 22 which is controlled by an astigmatism correction circuit 154 corrects the astigmatism generated in the illumination optics 2. An illumination aligner 23 adjusts the angle of the beam to the collimator lens 21 and the multi source module 3.

The multi source module 3 includes an aperture array 31, an electrostatic lens array 32, a blanker array 33, electrostatic octopole deflectors 34 and 36, and image rotation lens 35 and 37. The electrostatic lens array 32 is formed from three electrodes such as an upper electrode 32a, a center electrode 32b, and a lower electrode 32c and is controlled by a focus control circuit 151. The aperture array 31 is a diaphragm plate having apertures formed therein, and electron beams divided here are focused at the positions near the blanker array 33 through the electrostatic lens array 32. The blanker array 33 is a deflector group which independently deflects the individual beams and is controlled by a pattern generation circuit 152.

The electrostatic octopole deflector 34 deflects the electron beams having passed through the aperture array 31 and adjusts the beam angle so that the electron beams can pass through the electrostatic lens array 32. Also, the electrostatic octopole deflector 36 deflects the electron beams having passed through the electrostatic lens array 32 and adjusts the beam angle so that the electron beams can pass through the blanker array 33. Note that these deflectors may be electromagnetic deflectors. The image rotation lens 35 rotates the image of the electron beam having passed through the aperture array 31 to adjust the beam to the electrostatic lens array 32, and the image rotation lens 37 rotates the image of the electron beam having passed through the electrostatic lens array 32 to adjust the beam to the blanker array 33.

The electron beams divided in the multi source module 3 are projected at a position (height) of a first diaphragm 6a, the mark 8, and a sample (not shown) on the stage 5 through the projection optics 4 formed from symmetric magnetic doublet lens 41 and 42. Note that, on the stage 5, the first diaphragm 6a, the mark 8, and the sample (not shown) are placed at the approximately same height. Alternatively, a mechanism for detecting and adjusting the difference in height thereof is provided, or the relation in height thereof is known by the measurement performed in advance. Reference numerals 10, 10a, and 10b denote the multi electron beams projected on the stage 5. For the multi electron beams 10, 10a, and 10b as shown in FIG. 1, the angle between the optical axis of each beam and the normal of the object to which the beam is irradiated indicates the landing angle of each beam. The beams are detected by the landing detection system 6 placed on the stage 5 or the reflection/secondary electron detector 9, and the detection result is visualized through a signal processing circuit 157. The landing detection system 6 is formed from the first diaphragm 6a, a second diaphragm 6b, and a detector 6c. As described later, the first diaphragm 6a may be a thin film which does not completely block the beams. In the landing detection system 6, of the electrons having passed through the apertures of the first diaphragm 6a or scattered by a thin film, the electrons having passed through the apertures of the second diaphragm 6b are detected by the detector 6c. Note that the landing detection system 6 can be used as a normal transmission detector. In the case where the electrons are detected by the reflection/secondary electron detector 9, the mark 8 on the stage 5 is utilized. The position of the landing detection system 6 and that of the mark 8 can be arbitrarily changed by the stage 5. Also, at the time of lithography, a sample such as a wafer (not shown) is moved to the beam position by the stage 5. The movement of the stage 5 as described above is controlled by a stage control circuit 158.

A blanking aperture BA is provided in the projection optics 4, which blocks the electron beams deflected by the blanker array 33. The electron beam not blocked by the blanking aperture BA scans the stage 5 by the deflector 7. At this time, the deflector 7 is controlled by a deflection control circuit 156. By controlling the voltage of the blanker array 33 by the pattern generation circuit 152 in accordance with delineation data 160, the desired patterns are formed on the stage 5 and the sample (not shown).

An aligner control circuit 153 controls the illumination aligner 23 and the electrostatic octopole deflectors 34 and 36. A lens control circuit 155 controls the electron source demagnification lens 20, the collimator lens 21, the image rotation lens 35 and 37, and the doublet lens 41 and 42. The data control circuit 150 controls each of the control and processing circuits 151 to 158 and displays the detection results obtained through the detector 6c or the reflection/secondary electron detector 9 and the signal processing circuit 157 on a display 159 in synchronization with the aligner control circuit 153 or the deflection control circuit 156.

Next, as an example of the charged particle detection system, the multi electron beam lithography system in which the divergence angle on a sample and a detection plane is 20 mrad is shown in this embodiment.

FIG. 2A to FIG. 2D are diagrams schematically showing the structure of the electron beam detection system according to an embodiment of the present invention. As shown in FIG. 1, the landing detection system 6 is formed from the first diaphragm 6a, the second diaphragm 6b, and the detector 6c. The first diaphragm 6a has a fine hole 11. The fine hole 11 desirably has a diameter of about 1 μm or smaller, and the first diaphragm 6a should be formed from a thin film made of Si or the like so as to form such a fine hole. When the first diaphragm 6a is a thin film, since it cannot block the beam and scattered electrons are generated, the second diaphragm 6b has a role to block the scattered electrons from the detector 6c. However, when the hole diameter is smaller than the diameter of the beam to be measured, the beam is blocked by the first diaphragm 6a and the measurement accuracy is degraded. Therefore, it is preferable that the hole of the first diaphragm 6a has a size larger than the diameter of the beam to be measured at the position of the first diaphragm 6a.

Figure 2A:
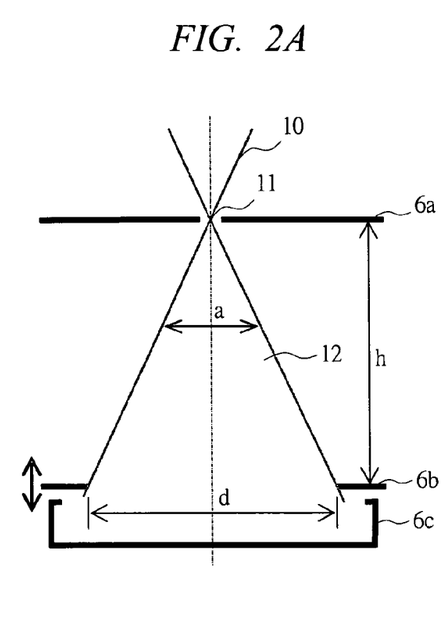
FIG. 2A is a diagram schematically showing the case where the landing angle of the beam to be measured is 0 rad in the landing detection system according to an embodiment of the present invention.
Figure 2B:
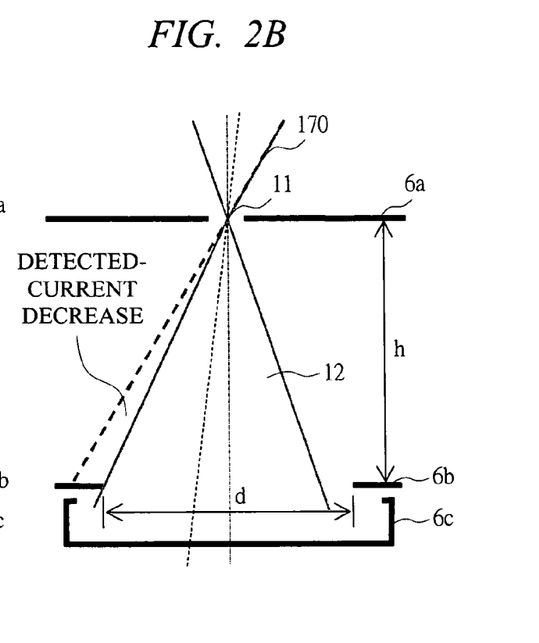
FIG. 2B is a diagram schematically showing the case where the landing angle of the beam to be measure is not 0 rad in the landing detection system according to an embodiment of the present invention.
Figure 2C:
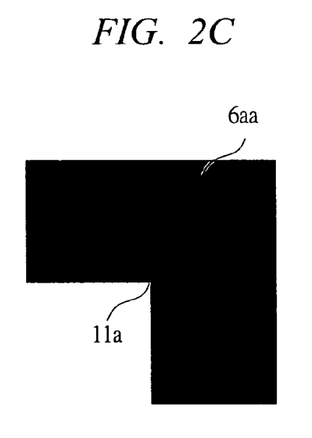
FIG. 2C is a diagram schematically showing an L-shaped knife edge in the landing detection system according to an embodiment of the present invention.
Figure 2D:
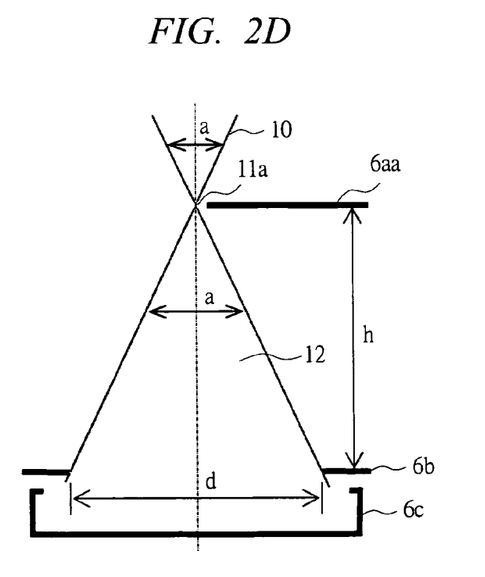
FIG. 2D is a diagram schematically showing an example of the landing angle measurement using the L-shaped knife edge in the landing detection system according to an embodiment of the present invention.

The first diaphragm 6a is located at an image plane of the projection optics 4, and a divergence angle of the electron beam 10 focused at the position of the first diaphragm 6a is 20 mrad. As shown in FIG. 2A, the first diaphragm 6a has the fine hole 11 and the second diaphragm 6b has an aperture 12. A detection angle a of the landing detection system 6 is determined based on a distance h between the first diaphragm 6a and the second diaphragm 6b and a diameter d of the second diaphragm aperture 12 (a=d/h). When the first diaphragm 6a is located at an image plane of the projection optics 4 and the divergence angle of the electron beam 10 focused at the position of the first diaphragm 6a is 20 mrad, if h is set to 15 mm (h=15 mm) and d is set to 0.3 mm (d=0.3 mm), the divergence angle of the electron beam 10 becomes equal to the detection angle a. Even when the divergence angle and the detection angle a are not equal to each other, the measurement can be performed. In such a case, however, the measurement accuracy is correspondingly degraded. Therefore, it is desired that the divergence angle and the detection angle a are equal to each other as much as possible. Also, it is desired that the detection angle is at least smaller than the divergence angle. Furthermore, in the case of the charged particle beam observation system and the charged particle beam processing system described later, the divergence angle changes in some cases depending on the conditions for use. In such a case, a mechanism which vertically moves the second diaphragm 6b is provided or the structure is modified so that the aperture diameter d of the second diaphragm 6b can be changed, thereby adjusting the second diaphragm 6b depending on the change of the divergence angle. Note that the shape of the apertures of the first diaphragm 6a and the second diaphragm 6b can be arbitrarily selected from rectangle, circle, and others.

In the illustration of FIG. 2, the direction from the center of the fine hole 11 of the first diaphragm 6a to the center of the aperture 12 of the second diaphragm 6b matches the normal of the plane of the first diaphragm 6a. In this case, when the landing angle of the electron beam 10 is 0 rad as shown in FIG. 2A, the amount of current detected by the detector 6c is maximized. When the landing angle of the electron beam 170 is shifted from 0 rad as shown in FIG. 2B, since a part of the beam is blocked by the second diaphragm 6b, the amount of detected current is decreased. Also, when an L-shaped knife edge 6aa shown in FIG. 2C is used instead of the first diaphragm 6a and a beam to be measured is irradiated at a position near a corner of the knife edge 11a as shown in FIG. 2D, the same effect can be achieved. More specifically, the fine hole 11 of the first diaphragm 6a can have any shape as long as the beam to be measured passes through one defined point on the first diaphragm 6a. As described above, when the direction connecting one point on the first diaphragm 6a and the center of the aperture 12 of the second diaphragm 6b is defined and the beam is landed in this direction, the amount of detected charged particles is maximized. Therefore, the landing angle of the beam to be measured is measured.

Figure 3A:
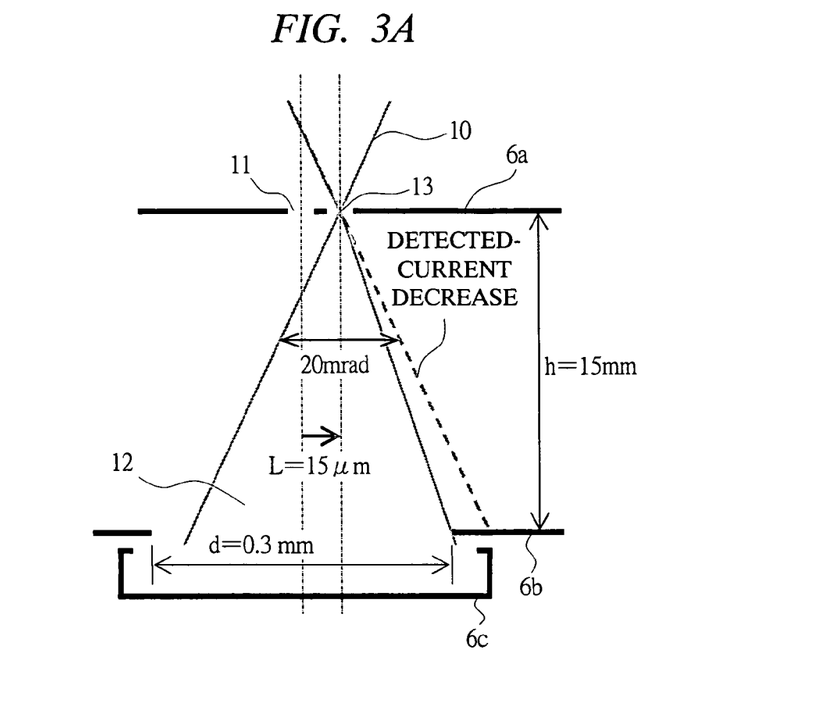
FIG. 3A is an explanatory diagram showing a landing angle measurement method in the case where a plurality of holes are formed in the first diaphragm and the landing angle of the beam to be measured is 0 rad.
Figure 3B:
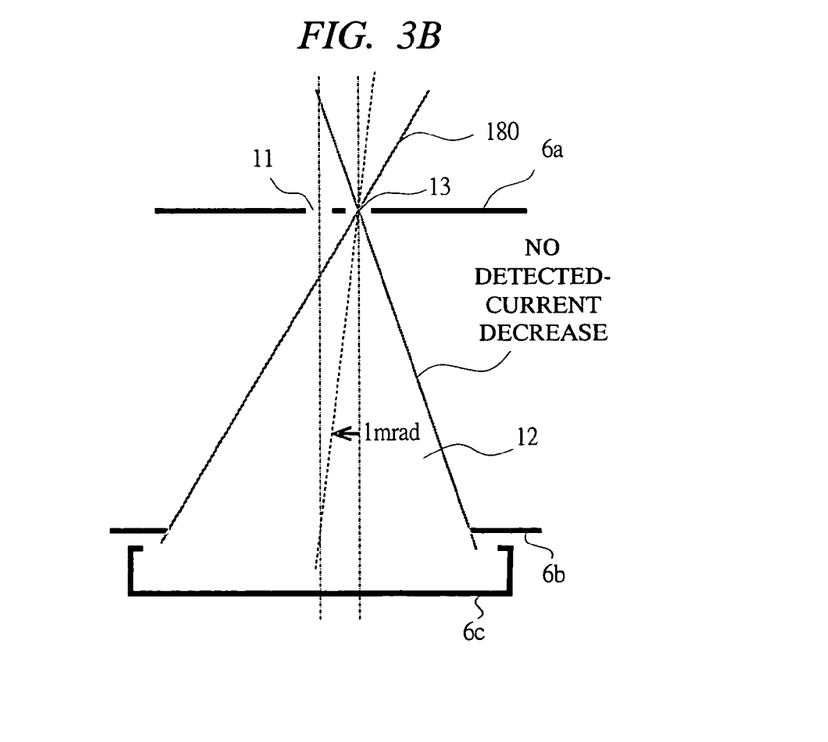
FIG. 3B is an explanatory diagram showing a landing angle measurement method in the case where a plurality of holes are formed in the first diaphragm and the landing angle of the beam to be measured is 1 mrad.

FIG. 3 is an explanatory diagram showing a landing angle measurement method in the case where a plurality of holes are formed in the first diaphragm (two in FIG. 3), in which FIG. 3A shows the case where the landing angle of the beam to be measured is 0 rad and FIG. 3B shows the case where the landing angle of the beam to be measured is 1 mrad.

As shown in FIG. 3, when another fine hole 13 is added to the first diaphragm 6a and the electron beam 10 with the landing angle of 0 rad is located at the fine hole 13, a part of the beam is blocked by the second diaphragm 6b. Therefore, the amount of detected current is decreased (FIG. 3A). Meanwhile, since the electron beam 180 passing through the center of the fine hole 13 and the center of the aperture 12 of the second diaphragm 6b is not blocked by the second diaphragm 6b as shown in FIG. 3B, the amount of current detected by the detector 6c is maximized. When the distance h between the first diaphragm 6a and the second diaphragm 6b is set to 15 mm (h=15 mm) as in the case shown in FIG. 3, if a pitch L of the fine holes 11 and 13 is set to 0.015 mm, the landing angle of the beam whose current amount is maximized at the position of the fine hole 13 is 1 mrad. As described above, the measurement resolution s of the landing angle is determined based on the pitch L of the fine holes and the distance h between the first diaphragm 6a and the second diaphragm 6b (s=L/h).

Figure 4A:
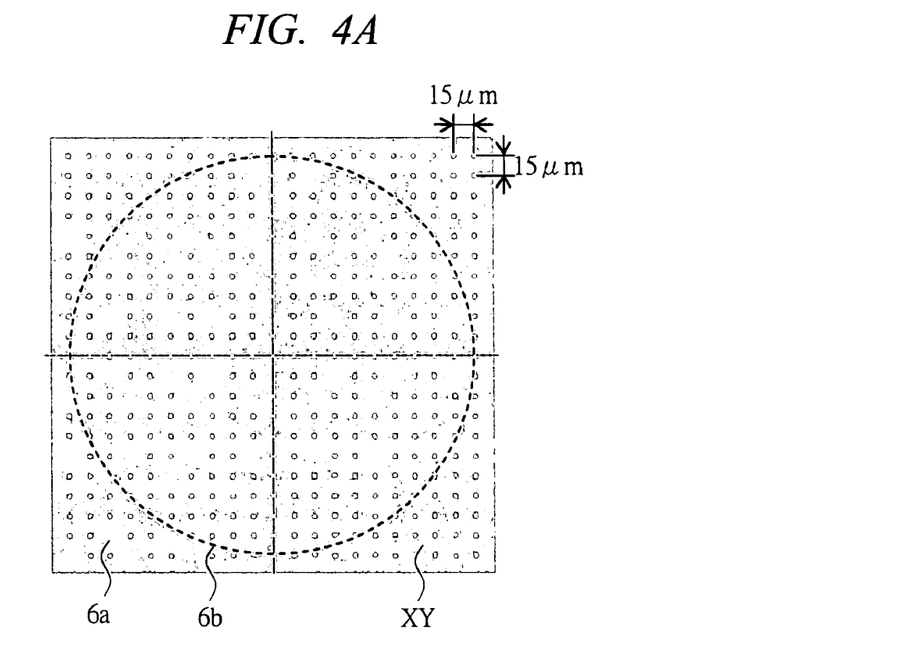
FIG. 4A is a schematic diagram of a silicon (Si) thin film having fine holes arranged in a lattice in a landing angle measurement method in the case where a plurality of holes are formed in a lattice in the first diaphragm.
Figure 4B:
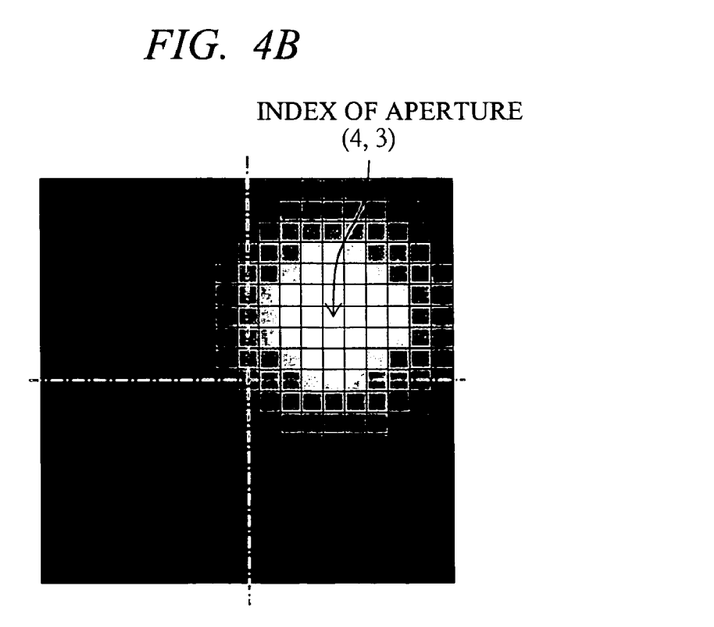
FIG. 4B is a diagram showing a measurement example in which the fine holes arranged in a lattice are used in the landing angle measurement method of FIG. 4A.

FIG. 4 is an explanatory diagram showing a landing angle measurement method in the case where a plurality of holes are formed and arranged in a lattice in the first diaphragm, in which FIG. 4A is a schematic diagram of a silicon (Si) thin film in which fine holes are arranged in a lattice, and FIG. 4B shows an measurement example in the case where the fine holes arranged in a lattice are used.

As shown in FIG. 4A, a plurality of fine holes XY are arranged in a lattice at even intervals (in this case, each 15 μm) in the first diaphragm 6a, and the fine holes XY are moved just below the beam by means of the stage 5 or the fine holes XY are moved near the beam by means of the stage 5 and the fine holes XY are scanned by the deflector 7 to measure the position of the fine hole where the amount of detected current is maximized. By this means, the landing angle of the beam can be acquired. Note that, in this case, the diameter of the aperture of the second diaphragm 6b is, for example, 300 μm. The measurement result is visualized as shown in FIG. 4B. In this visualization, the current values at each fine hole XY can be displayed by gray scale as shown in FIG. 4B, or displayed by color scale, contour map, or numerical values. In this case, the index of the fine holes XY at which the amount of detected current is maximized is (4,3). For example, if the landing angle is 0 rad at the center fine hole, the landing angle of the beam is 5 mrad. As described above, when the index (vertical and horizontal coordinates) of the fine hole at which the landing angle is 0 rad is known in advance through other method (for example, accurate measurement is performed after the assembly), the index of the fine hole at which the maximum amount of the detected current can be obtained can be converted to the landing angle, and the absolute value of the landing angle can be thus obtained. Also, the landing angle shown here is the landing angle to a detection plane (plane of the first diaphragm 6a), and if the angle between the sample and the detection plane is known, the absolute value of the landing angle to the sample can be obtained through the method described above.

Figure 5A:
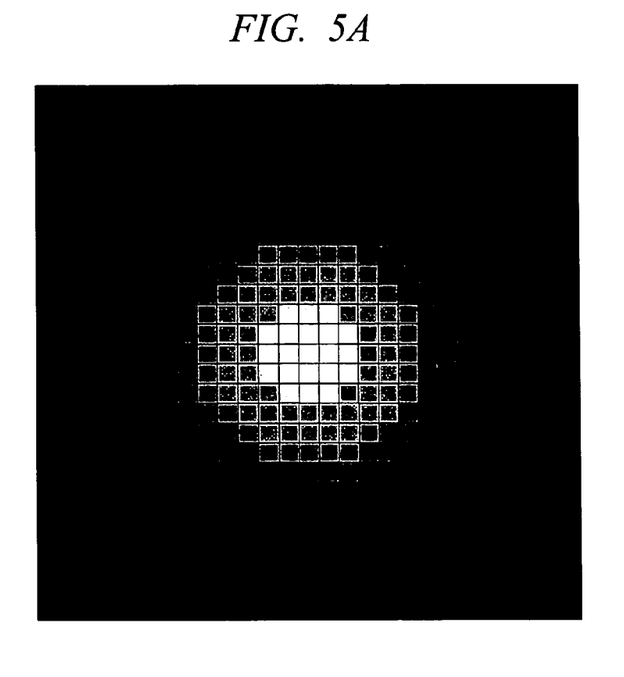
FIG. 5A is a diagram showing an example of a measurement result display image when the detection angle and the divergence angle of the beam to be measured are almost equal to each other in an example of the landing angle measurement in the case where a plurality of holes of the first diaphragm are arranged in a lattice.
Figure 5B:
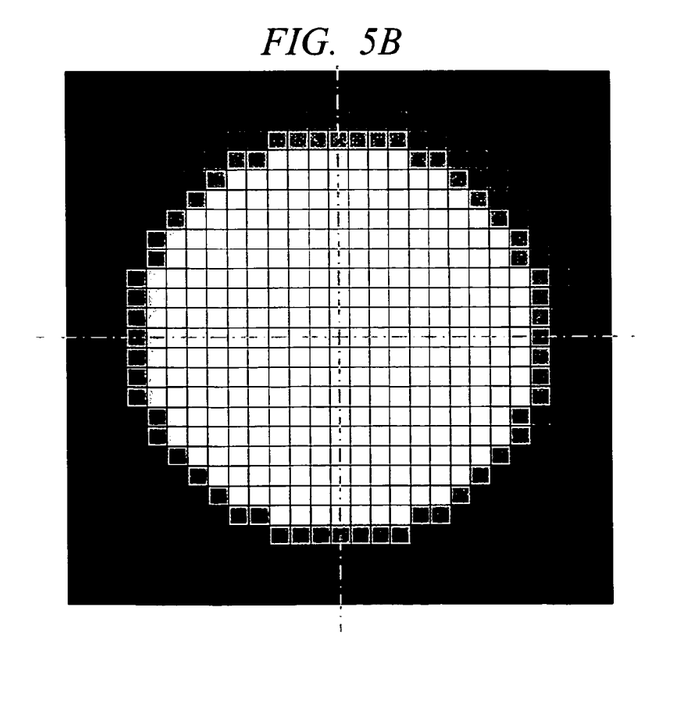
FIG. 5B is a diagram showing an example of a measurement result display image when the detection angle is smaller than the divergence angle in an example of the landing angle measurement in the case where a plurality of holes of the first diaphragm are arranged in a lattice.

FIG. 5A and FIG. 5B are diagrams showing the difference in measurement display image resulting from the difference in the aperture diameter of the second diaphragm 6b. FIG. 5A shows the case where the diameter of the aperture is 300 μm and the detection angle and the divergence angle of the beam to be measured are almost equal to each other. In FIG. 5B, the diameter of the aperture is assumed to be 60 μm and the detection angle is smaller than the divergence angle of the beam. When the detection angle is smaller than the divergence angle, there are a plurality of fine holes XY at which the amount of detected current is maximized. However, by using the index of the hole located at the center of them, the landing angle of the beam to be measured can be obtained. Furthermore, when the diameter of the aperture of the second diaphragm 6b is further reduced, the holes at which the current can be detected and those at which the current cannot be detected are clearly distinguished. In this case, the area in which the current can be detected corresponds to the divergence angle of the beam to be measured. Note that, in FIG. 4B and FIG. 5, the light-colored area corresponds to the part in which the amount of current is large.

In the multi electron beam lithography system shown in FIG. 1, in the case where the desired lens conditions are not achieved in the projection optics 4, for example, when the combination of the lens excitation of the symmetric doublet lens 41 and 42 is not appropriate, the landing angle of the off-axial electron beams 10a and 10b is increased. According to the present invention, since the landing angle of the beam can be measured, the landing angle of the off-axial electron beams 10a and 10b is monitored and the monitor result can be fed back to the conditions of the symmetric doublet lens 41 and 42 of the projection optics 4.

Figure 6A:
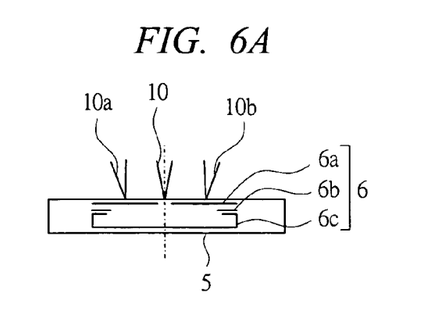
FIG. 6A is a diagram showing an example of the landing angle measurement of the axial beam or the paraxial beam in the measurement process and the feedback process to the lens conditions in the multi electron beam lithography system in an embodiment of the present invention.
Figure 6B:
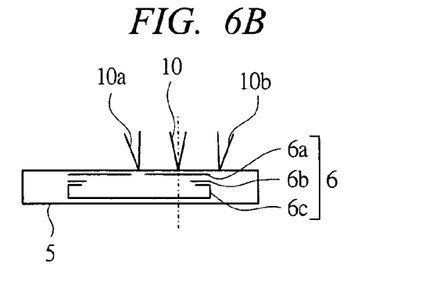
FIG. 6B is a diagram showing an example of the landing angle measurement of the off-axis beam in the measurement process and the feedback process to the lens conditions in the multi electron beam lithography system in an embodiment of the present invention.
Figure 6C:
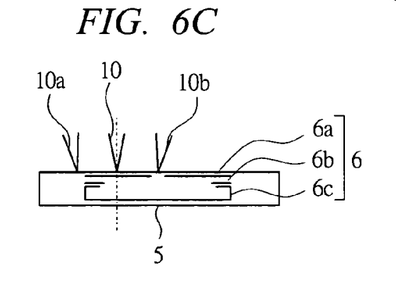
FIG. 6C is a diagram showing an example of the landing angle measurement of the off-axis beam in the measurement process and the feedback process to the lens conditions in the multi electron beam lithography system in an embodiment of the present invention.
Figure 6D:
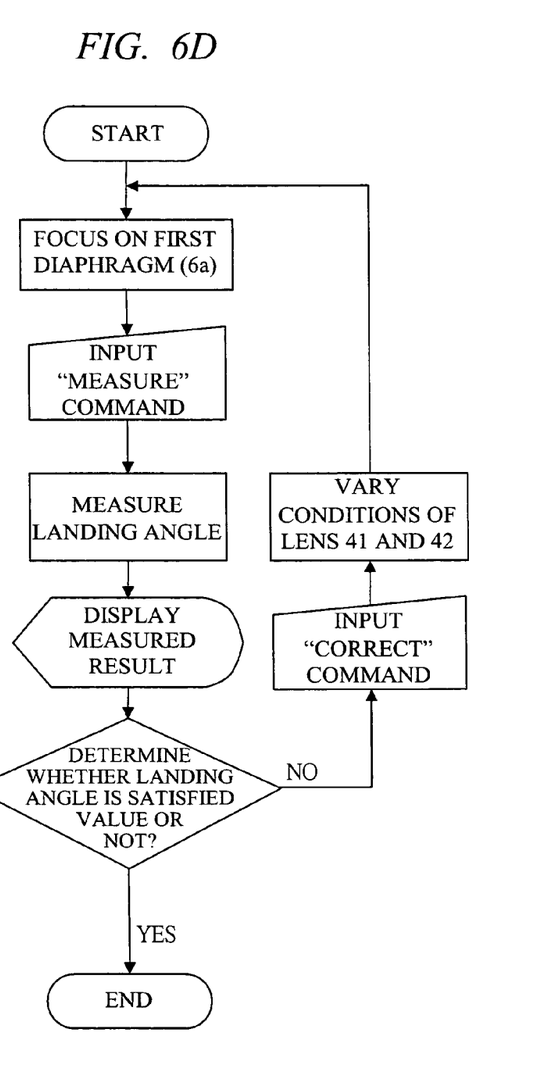
FIG. 6D is a flowchart showing the process of feeding back the landing angle measurement to the lens conditions in an embodiment of the present invention.

The flow of the landing angle measurement of the multi electron beams is shown in FIG. 6A to FIG. 6C. First, as shown in FIG. 6A, the stage 5 is moved so that the center of the landing detection system 6 is positioned near the paraxial electron beam 10, and the landing angle is measured. In the case of the measurement of the multi electron beams, it is desired that the beams other than the beam to be measured are blanked. Next, as shown in FIG. 6B, the stage 5 is moved so that the center of the landing detection system 6 is positioned near the off-axial electron beam 10a, and the landing angle is measured. By acquiring the difference between the index of the fine hole at which the maximum current value is observed at the time of the measurement of the paraxial electron beam 10 and the index of the fine hole at which the maximum current value is observed at the time of the measurement of the off-axial electron beam 10a, the relative landing angle can be obtained. As described above, when measuring the relative landing angle, it is not always necessary to know the index at which the landing angle is 0 rad in advance. Further, since the relative landing angle for the detection plane and the relative angle for the sample are the same, it is not always necessary to know the angle of the sample and the detection plane in advance. Also, as shown in FIG. 6C, by the measurement for the off-axial electron beam 10b in the same manner, the difference in the index from the paraxial electron beam 10 can be obtained, and the relative landing angle of the electron beam 10b can be obtained. In the manner as described above, the measurements are repeated while changing the values of the doublet lens 41 and 42 so that the relative landing angle becomes 0 rad or can be reduced as small as possible, thereby obtaining the optimum projection optics conditions. FIG. 6D shows a flowchart of the above-described feedback process to the lens conditions.

Also, in the charged particle lithography system including the multi electron beam lithography system and a variable shaped/cell projection lithography system, a charged particle beam observation system such as the scanning electron microscope, and a charged particle beam processing system such as the focused ion beam processing system, the landing angle changes in some cases when the beam is deflected. When the change in the landing angle due to the beam deflection is to be inspected, based on the fine hole index at which the charged particle amount is maximum before the deflection, the stage 5 is moved by the deflection amount after the deflection to obtain the index of the fine hole at which the charged particle amount is maximum. From the difference in the fine hole index at which the charged particle amount is maximum between before and after the deflection, the relative landing angle can be obtained. An example thereof is shown in FIG. 7 and FIG. 8.

Figure 7:
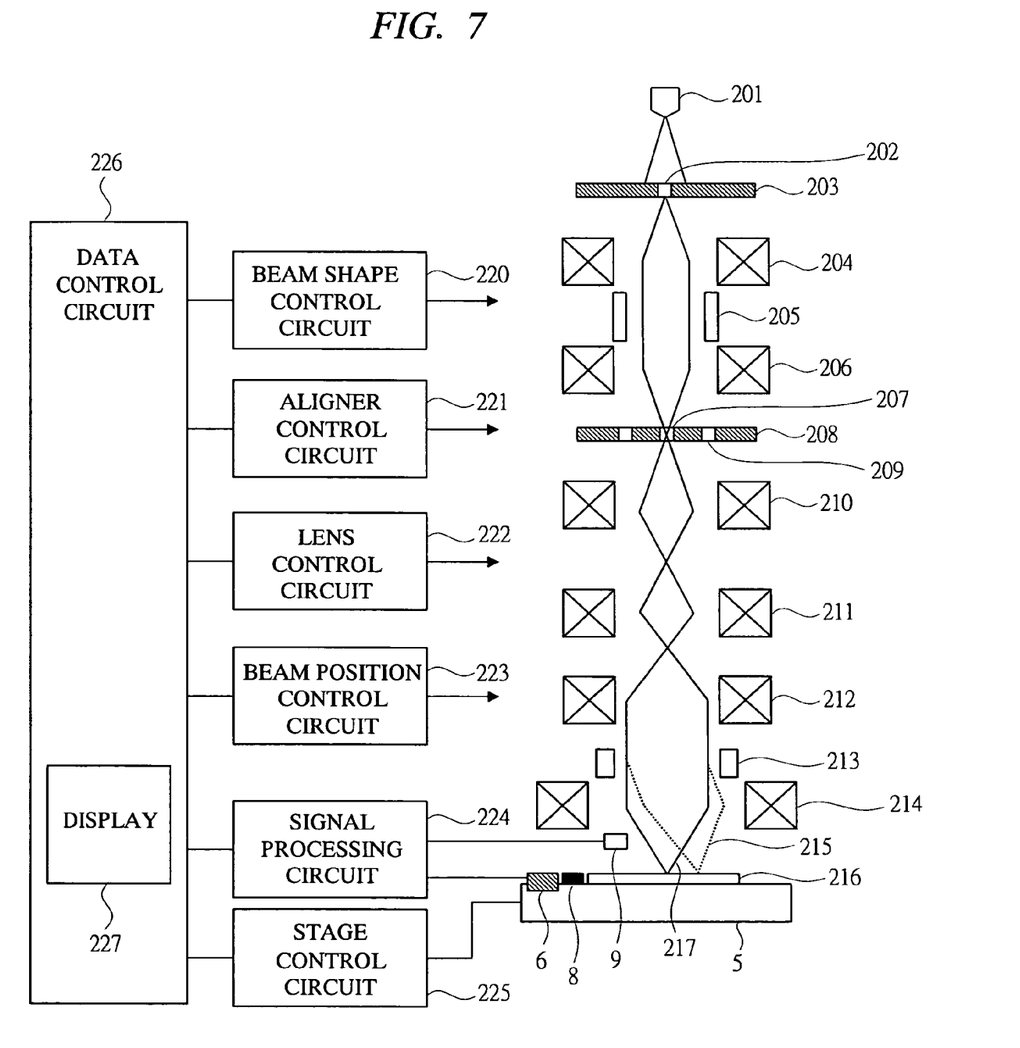
FIG. 7 is a diagram schematically showing the variable shaped/cell projection electron beam lithography system according to an embodiment of the present invention.
Figure 8A:
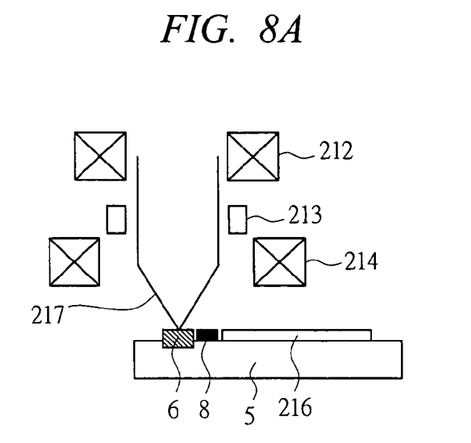
FIG. 8A is a diagram showing the state before defection in an example of the landing angle measurement in the variable shaped/cell projection electron beam lithography system according to an embodiment of the present invention.
Figure 8B:
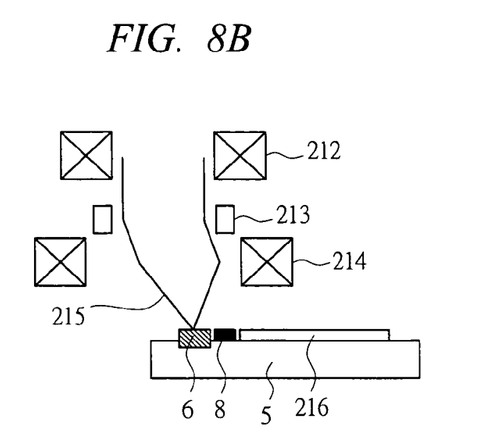
FIG. 8B is a diagram showing the state after defection in an example of the landing angle measurement in the variable shaped/cell projection electron beam lithography system according to an embodiment of the present invention.
Figure 8C:
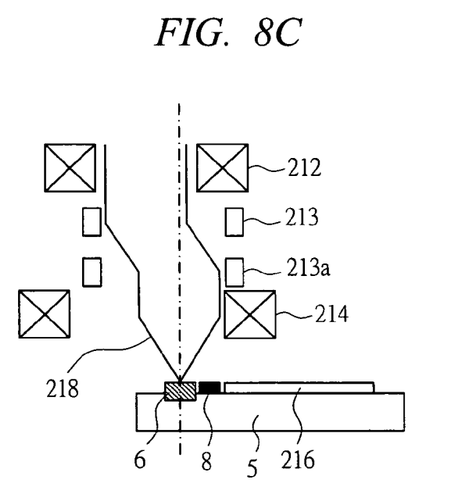
FIG. 8C is a diagram showing the state after defection in an example of the landing angle measurement in the variable shaped/cell projection electron beam lithography system according to an embodiment of the present invention.
Figure 8D:
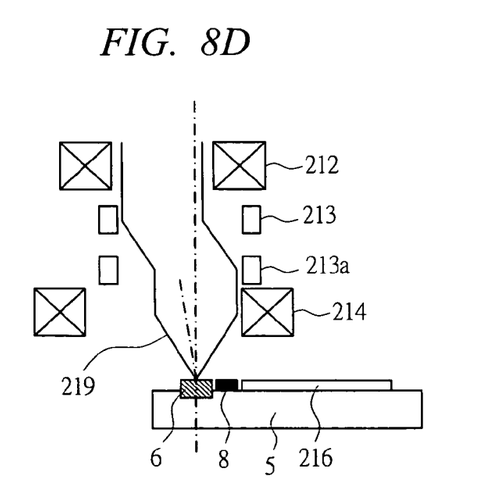
FIG. 8D is a diagram showing the state after defection in an example of the landing angle measurement in the variable shaped/cell projection electron beam lithography system according to an embodiment of the present invention.

FIG. 7 is a diagram schematically showing the variable shaped/cell projection electron beam lithography system according to an embodiment of the present invention.

For example, the variable shaped/cell projection electron beam lithography system according to this embodiment is composed of an electron source 201, a first mask 203 having a rectangular aperture 202, a first shaping lens 204, a beam shaping deflector 205, a second shaping lens 206, a second mask 208 having a rectangular aperture 207 and a cell aperture 209, a first projection lens 210, a second projection lens 211, a first objective lens 212, an objective deflector 213, a second objective lens 214, the stage 5, the landing detection system 6, the mark 8, the reflection/secondary electron detector 9, a data control circuit 226 having a display 227, a beam shape control circuit 220, an aligner control circuit 221, a lens control circuit 222, a beam position control circuit 223, a signal processing circuit 224, a stage control circuit 225, and others.

This embodiment is directed to the electron beam lithography system to which both of the variable shaped method and the cell projection method can be applied. The electron beam emitted from the electron source 201 and accelerated to 50 keV is irradiated to the first mask 203 having the rectangular aperture 202 formed therein, and an image of the rectangular aperture is formed on the second mask 208 through the first shaping lens 204 and the second shaping lens 206. The rectangular aperture 207 for variable shaping and a plurality of cell apertures 209 are formed in the second mask 208. The position of the image of the first mask on the second mask 208 is controlled by the beam shaping deflector 205 and the beam shape control circuit 220 provided between the two masks. The transmission electron beam formed by the two masks is reduced by the first projection lens 210 and the second projection lens 211, and finally, transferred onto the sample 216 placed on the stage 5 through the first objective lens 212 and the second objective lens 214. These lens are driven by the lens control circuit 222. Simultaneously, the axis of the electron beam is adjusted by the aligner control circuit 221. The position of the electron beam on the sample 216 is controlled by the objective deflector 213. By the operation of the objective deflector 213, the electron beam trajectory 217 is changed to the deflected electron beam trajectory 215. The mark 8 for detecting a position is provided on the stage 5. By using a laser interferometer for measuring the position of the sample 216 and the stage 5, a transmission electron detector (used together with the landing detection system 6), the signal processing circuit 224, and the stage control circuit 225, the position of the electron beam can be measured. Further, since the landing detection system 6 according to the present invention is provided on the stage 5, the landing angle of the electron beam and the divergence angle can be measured. The data control circuit 226 performs the overall control thereof, and the control results and the measurement results are displayed on the display 227.

FIG. 8 shows an example of the landing angle measurement in the case where the beam is deflected in the variable shaped/cell projection electron beam lithography system. The landing detection system 6 is the same as those shown in FIG. 2 and FIG. 4. When the change in the landing angle due to deflection is to be measured, the landing angle is first measured in a state before the deflection as shown in FIG. 8A, and after the beam deflection, the stage 5 is moved by the amount corresponding to the deflection (FIG. 8B), and then, the condition in which the amount of the detected current is maximized is measured and the difference from that before the deflection is obtained. At this time, if the first diaphragm having the aperture lattice as shown in FIG. 4 is used, the change in the landing angle due to the deflection can be obtained by comparing the index of the holes at which the amount of the detected current is maximum between before and after the deflection. Also, when two stages of the objective deflector 213 (213 and 213a) are provided as shown in FIG. 8C and FIG. 8D, the landing angle at the time of deflection is changed depending on the combination of the deflection amount of the two stage deflectors. In the case where the landing angle of 0 rad at the time of the deflection is the desired condition like the beam 218 shown in FIG. 8C, if the landing angle is tilted in a measurement result like the beam 219 shown in FIG. 8D, the desired landing angle can be obtained by repeating the adjustment of the deflection amount ratio of the objective lens 213 and 213a and the measurement of the landing angle.

Figure 9:
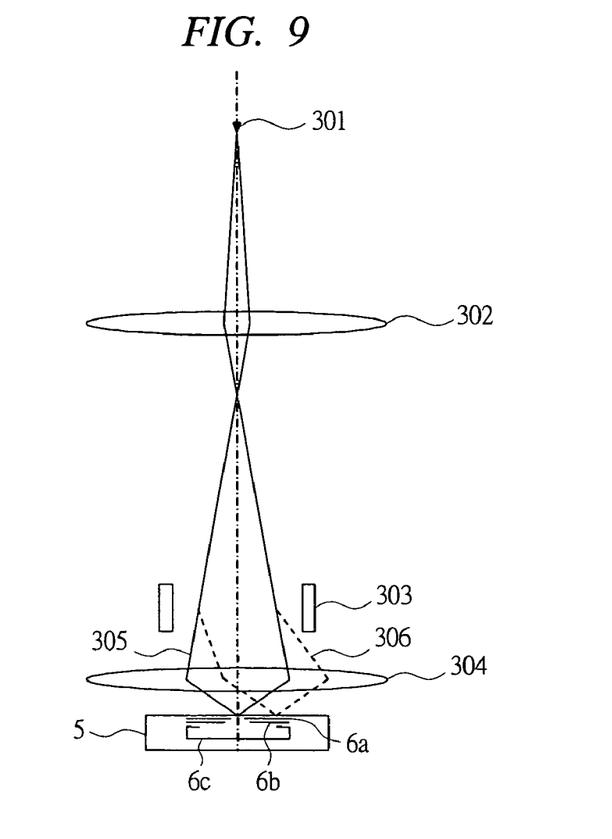
FIG. 9 is a block diagram schematically showing the scanning electron microscope and the focused ion beam observation system according to an embodiment of the present invention.

FIG. 9 is a block diagram showing the scanning electron microscope according to an embodiment of the present invention. For example, the scanning electron microscope according to this embodiment is composed of an electron source 301, a condenser lens 302, a deflector 303, an objective lens 304, the stage 5, the landing detection system 6 having the first diaphragm 6a, the second diaphragm 6b, and the detector 6c, and others. Note that the focused ion beam observation system also has the almost same structure and it has an ion source instead of the electron source 301.

The electron beam emitted from the electron source 301 is focused on the stage 5 through the condenser lens 302 and the objective lens 304. The electron beam 305 focused on the stage 5 scans the sample on the stage 5 by the deflector 303. A reference numeral 306 denotes the electron beam deflected by the deflector 303.

Figure 10A:
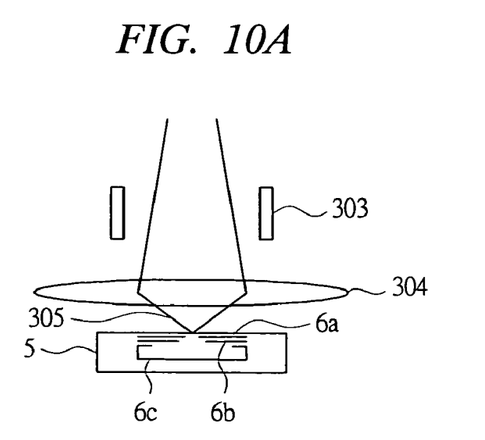
FIG. 10A is a diagram showing the state before the deflection in an example of the landing angle measurement in the scanning electron microscope and the focused ion beam observation system according to an embodiment of the present invention.
Figure 10B:
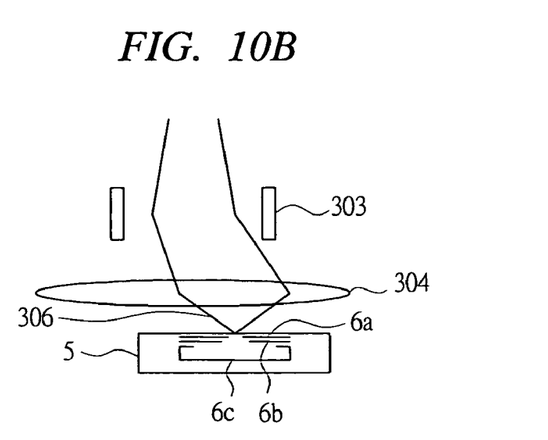
FIG. 10B is a diagram showing the state after the deflection in an example of the landing angle measurement in the scanning electron microscope and the focused ion beam observation system according to an embodiment of the present invention.

FIG. 10 shows an example of the landing angle measurement in the case where the beam is deflected in the scanning electron microscope and the focused ion beam observation system. The landing detection system 6 composed of the first diaphragm 6a, the second diaphragm 6b, and the detector 6c is the same as those shown in FIG. 2 and FIG. 4. When the change in the landing angle due to the deflection is to be measured, the landing angle is first measured in a state before the deflection as shown in FIG. 10A and after the beam deflection, the stage 5 is moved by the amount corresponding to the deflection (FIG. 10B), and then, the condition in which the amount of the detected current is maximized is measured and the difference from that before the deflection is obtained. At this time, if the first diaphragm 6a having the aperture lattice as shown in FIG. 4 is used, the change in the landing angle due to the deflection can be obtained by comparing the index of the holes at which the amount of the detected current is maximum between before and after the detection.

The structure in which the landing angle is measured by using the fine holes other than those arranged in a lattice shown in FIG. 4 will be described below.

Figure 11A:
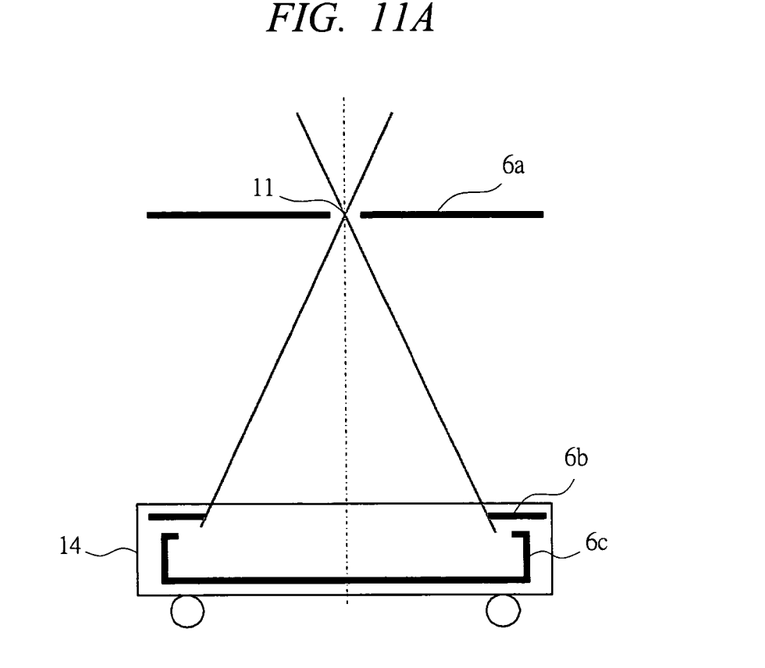
FIG. 11A is a diagram showing a measurement mechanism different from that using fine holes arranged in a lattice according to an embodiment of the present invention, which illustrates an example where a movable stage is provided.

FIG. 11A shows a structure in which a pair of the second diaphragm 6b and the detector 6c is mounted on a movable stage 14. In this structure, the stage position at which the amount of detected current of the beam having passed through the fine hole 11 is maximum is converted to the landing angle. When the position detecting accuracy of the movable stage 14 is 0.0015 mm (1.5 μm), the measurement accuracy of the landing angle is 0.1 mrad. This structure can be applied to the case where the first diaphragm 6a has a single hole as shown in FIG. 2A, and it can be complementarily used for the structure having the holes arranged in a lattice as shown in FIG. 4A. Also, when the detection area of the detector 6c is sufficiently large, the same effect can be achieved also in the structure in which only the second diaphragm 6b is movable.

Note that it is desired that the minimum unit length of the mechanical movement of the relative position between the first diaphragm 6a and the second diaphragm 6b is shorter than the aperture diameter of the second diaphragm 6b.

It is also desired that maximum movable length of the mechanical movement of the relative position between the first diaphragm 6a and the second diaphragm 6b is longer than the aperture diameter of the second aperture 6b.

Figure 11B:
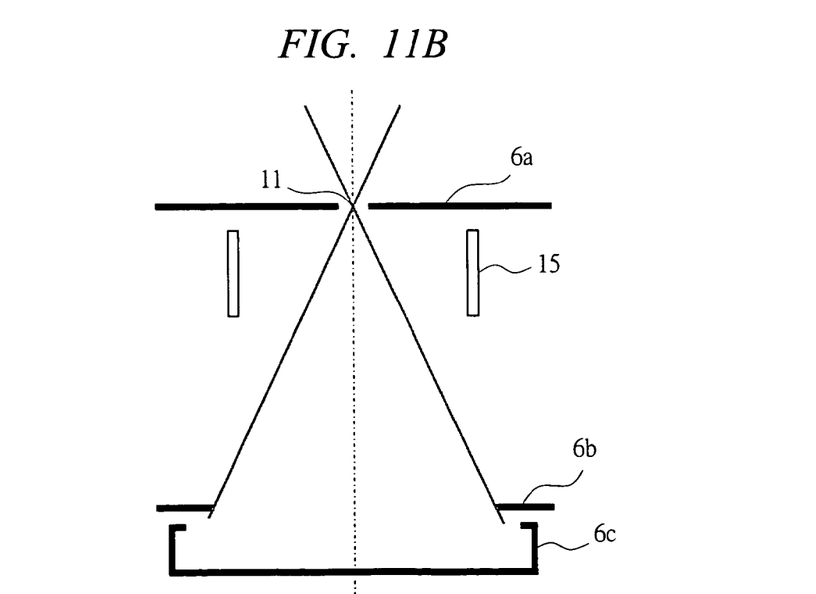
FIG. 11B is a diagram showing a measurement mechanism different from that using fine holes arranged in a lattice according to an embodiment of the present invention, which illustrates an example where a deflector is provided.

FIG. 11B shows a structure in which the deflector 15 is provided between the first diaphragm 6a and the second diaphragm 6b. The deflector 15 is assumed to have a structure capable of two-dimensional deflection such as an electrostatic quadrupole deflector or an electrostatic octopole deflector. In this method, by obtaining the deflection sensitivity of the deflector 15 (relation between the applied voltage and the deflection angle) in advance, the voltage applied to the deflector 15 is converted to the landing angle so that the amount of detected current of the beam having passed through the fine hole 11 becomes maximum. The landing angle measurement accuracy is determined by the resolution of the applied voltage, and the resolution higher than those in the structures shown in FIG. 2 to FIG. 4 can be obtained in this structure. This structure can be applied to the case where the first diaphragm 6a has a single hole as shown in FIG. 2A, and it can be complementarily used for the structure having the holes arranged in a lattice as shown in FIG. 4A. Further, the structure in which the deflector 15 also functions as the fine hole 11 of the first diaphragm 6a is also preferable.

Note that it is desired that the deflectable length by the deflector 15 is longer than the aperture diameter of the second diaphragm 6b.

As described above, in the charged particle beam angle detection system according to an embodiment of the present invention, even when the amount of current of the charged particle beam is small, the landing angle thereof can be measured with high accuracy. Since the landing angle can be measured with high accuracy, the highly accurate optical adjustment and the writing with high positional accuracy can be achieved in the charged particle beam lithography system, and it becomes possible to improve the yield and the throughput in the device manufacturing. Also, the highly accurate optical adjustment and the image observation with high positional accuracy can be achieved in the charged particle beam observation system, and the highly accurate optical adjustment and the processing with high positional accuracy can be achieved in the charged particle beam processing system.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to the charged particle beam lithography system, the charged particle beam observation system, the charged particle beam processing system, and others.

What is claimed is:

1. A charged particle beam application system, comprising:
   a charged particle source;
   a charged particle lens for converging charged particle beam emitted from said charged particle source;
   a stage for placing an object to which said charged particle beam is irradiated; and
   means for measuring a landing angle of said charged particle beam.

2. The charged particle beam application system according to claim 1,
   wherein said means for measuring the landing angle includes a charged particle beam detector, and
   the landing angle and/or a convergence angle are obtained from the amount of charged particles detected by said charged particle beam detector.

3. The charged particle beam application system according to claim 1,
   wherein a detection system including a first diaphragm, a second diaphragm, and a charged particle beam detector is provided, and
   an angle determined by a distance between said first diaphragm and said second diaphragm and an aperture diameter of said second diaphragm is almost equal to or smaller than a convergence angle of said charged particle beam near said detection system.

4. The charged particle beam application system according to claim 3, further comprising:
   a function to measure the amount of charged particles passing through said first diaphragm and said second diaphragm and feed back the measurement result to lens conditions and deflector conditions.

5. The charged particle beam application system according to claim 3,
   wherein the angle determined by a distance between said first diaphragm and said second diaphragm and an aperture diameter of said second diaphragm is variable.

6. The charged particle beam application system according to claim 3,
   wherein a hole of said first diaphragm is larger than a diameter of the charged particle beam at a position of said first diaphragm.

7. The charged particle beam application system according to claim 1,
   wherein a detection system including a first diaphragm, a second diaphragm, and a charged particle beam detector is provided, and
   said first diaphragm has a plurality of holes arranged at even intervals.

8. The charged particle beam application system according to claim 7,
   wherein said plurality of holes are arranged in a lattice.

9. The charged particle beam application system according to claim 7,
   wherein pitch of said plurality of holes is shorter than an aperture diameter of said second diaphragm.

10. The charged particle beam application system according to claim 7,
    wherein an entire size of said plurality of holes is larger than the aperture of said second diaphragm.

11. The charged particle beam application system according to claim 1,
    wherein a detection system including a first diaphragm, a second diaphragm, and a charged particle beam detector is provided, and
    a relative position of said first diaphragm and said second diaphragm can be mechanically moved.

12. The charged particle beam application system according to claim 11,
    wherein a minimum unit length of the mechanical movement of said relative position is shorter than the aperture diameter of said second diaphragm.

13. The charged particle beam application system according to claim 11,
    wherein a maximum movable length of the mechanical movement of said relative position is longer than the aperture diameter of said second diaphragm.

14. The charged particle beam application system according to claim 1,
    wherein a detection system including a first diaphragm, a second diaphragm, and a charged particle beam detector is provided, and
    a deflector is provided between said first diaphragm and said second diaphragm.

15. The charged particle beam application system according to claim 14,
    wherein said deflector functions also as said first diaphragm.

16. The charged particle beam application system according to claim 14,
    wherein a deflectable length by said deflector is longer than the aperture diameter of said second diaphragm.

17. The charged particle beam application system according to claim 1,
    wherein a detection system including a first diaphragm, a second diaphragm, and a charged particle beam detector is provided, and
    a current passing through said first diaphragm and said second diaphragm is measured under different charged particle beam conditions.

18. The charged particle beam application system according to claim 17,
    wherein said different charged particle beam conditions are different multi beams.

19. The charged particle beam application system according to claim 17,
    wherein said different charged particle beam conditions are the deflection amount of the beam.

* * * * *